(12) United States Patent
Paul

(10) Patent No.: US 7,995,368 B2
(45) Date of Patent: Aug. 9, 2011

(54) MEMORY CELL ARCHITECTURE

(75) Inventor: Bipul C. Paul, Sunnyvale, CA (US)

(73) Assignee: Toshiba America Research, Inc., Piscataway, NJ (US)

( * ) Notice: Subject to any disclaimer, the term of this patent is extended or adjusted under 35 U.S.C. 154(b) by 710 days.

(21) Appl. No.: 12/034,321

(22) Filed: Feb. 20, 2008

(65) Prior Publication Data

US 2009/0207644 A1 Aug. 20, 2009

(51) Int. Cl.
*G11C 17/00* (2006.01)
(52) U.S. Cl. .......................................... 365/94; 365/100
(58) Field of Classification Search .................. 365/94, 365/100, 148, 163, 189.16
See application file for complete search history.

(56) References Cited

U.S. PATENT DOCUMENTS

| 6,587,364 | B1 * | 7/2003 | Kablanian et al. | 365/63 |
| 6,587,394 | B2 * | 7/2003 | Hogan | 365/230.06 |
| 6,937,509 | B2 * | 8/2005 | Perner et al. | 365/171 |
| 2006/0187697 | A1 * | 8/2006 | Khanuja | 365/94 |

OTHER PUBLICATIONS

A. Moshovos et al., "A Case for Asymmetric-Cell Cache Memories," IEEE Transactions on Very Large Scale Integration (VL:SI) Systems, vol. 13, No. 7, Jul. 2005, pp. 877-881.

N. Azizi et al., "An Asymmetric SRAM cell to lower Gate Leakage," IEEE Computer Society, 0-7695-2093-6/04 2004 IEEE.
Y. Yibin, et al., "Evaluation of Differential vs. Single-Ended Sensing and Asymmetric Cells in 90nm Logic Technology for On-Chip Caches," ISCAS 2006, pp. 963-966.
N. Azizi, et al., "Low-leakage Asymmetric-Cell SRAM," IEEE Transactions on Very Large Scale Integration (VLSI) Systems, vol. 11, No. 4, Aug. 2003, pp. 701-715.

* cited by examiner

*Primary Examiner* — Vu A Le
(74) *Attorney, Agent, or Firm* — Westerman, Hattori, Daniels & Adrian, LLP

(57) ABSTRACT

Embodiments of the present invention disclose a memory architecture for optimizing memory performance and size. Memory optimization is realized by configuring the memory to a particular logic state; that is, restricting memory data storage to either logic "0" or "1." The opposite logic state, "1" or "0," can be available through initialization and, therefore, may be presumed. Accordingly, the presumed, initialized logic state is available unless the configured logic state in memory changes the initialized data during memory access. Memory size reduction is realized by restricting physical memory to contain only cells that store data. Memory size can be further reduced by eliminating redundant data rows and columns. By reducing memory size, processing speed can be enhanced and power consumption reduced relative to conventional memory structures.

36 Claims, 9 Drawing Sheets

```
0  0  0  0  0  0  0                              1
0  0  0  0  0  0  1                           1  1
0  0  0  0  0  1  1                        1  1  1
0  0  0  0  1  1  1                     1  1  1  1
0  0  0  1  1  1  1                  1  1  1  1  1
0  0  1  1  1  1  1               1  1  1  1  1  1
0  1  1  1  1  1  1            1  1  1  1  1  1  1
```

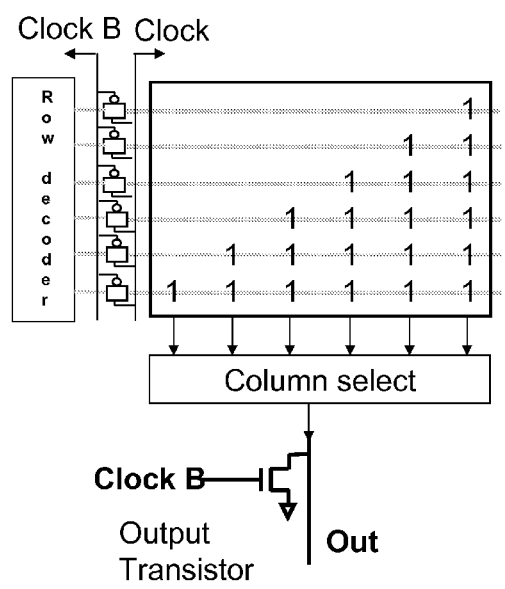 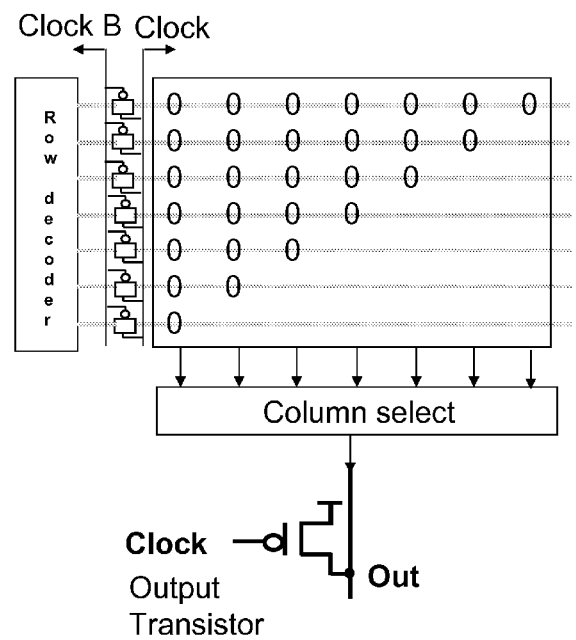
FIG. 4(a)　　　　　　　FIG. 4(b)
FIG. 4

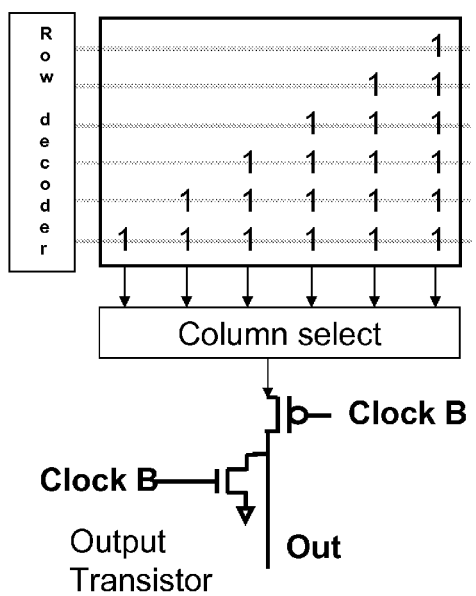 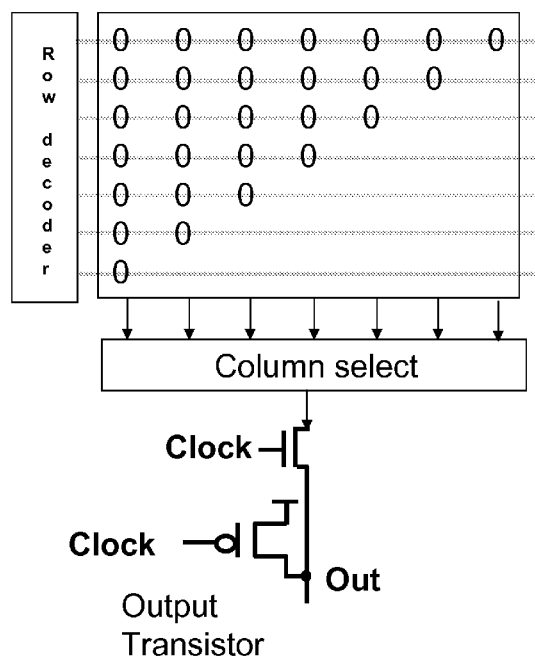
FIG. 5(a)　　　　　　　　FIG. 5(b)
FIG. 5

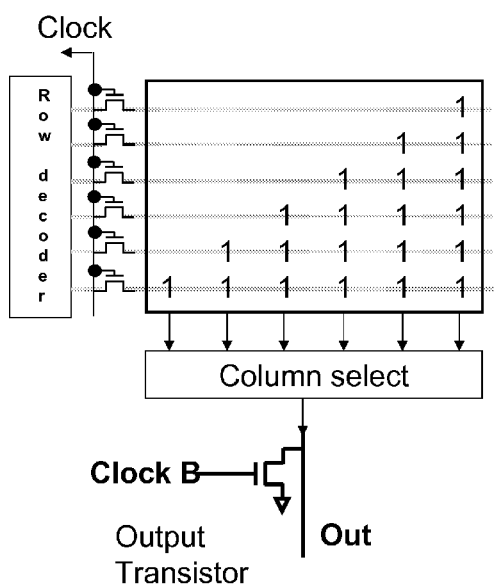 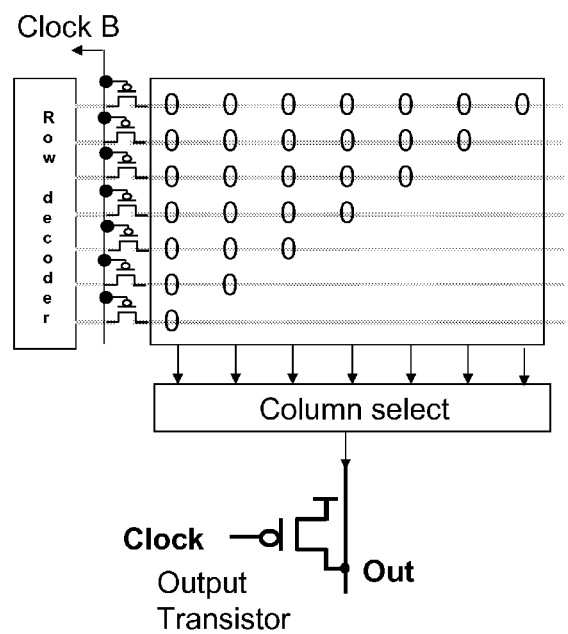
FIG. 6(a)           FIG. 6(b)
FIG. 6

MEMORY CELL ARCHITECTURE

BACKGROUND

1. Field of the Invention

The present invention relates to memory cell architecture. More particularly, the present invention relates to optimizing memory cell architecture through optimization of memory cell structure.

2. Description of the Related Art

Read only memory (ROM) is a data storage device used in a variety of electrical systems. Generally, data stored in ROM is permanently fixed; that is, the data is nonvolatile. Data is stored in ROM through a variety of programming methods. In certain applications, ROM storage devices are used to implement specific logic functions for various applications, such as programs or processes. One traditional approach to function implementation determines the function output for all possible input combinations (ROM-Based Computation). In this approach, rather than evaluating a logic function in real time, function output is read from memory where all possible outputs are pre-stored. This approach is commonly seen in applications such as Field Programmable Gate Array (FPGA) architecture, and is used to implement basic logic gates such as NAND, NOR, XOR, or even 1 bit full adder. Large functions can also be implemented using this basic cell structure, but the approach is usually slower than conventional logic designs. Further, since a large memory size ($2N \times O$ bits; where N is the number of inputs, and O the number of outputs) is required to implement large functions using a single look-up table, straight-forward implementation of large functions is also not feasible in terms of speed, memory size, and power consumption. Accordingly, what is needed is a memory cell structure that enables implementation of high performance logic functions and benefits from improved performance, reduced memory size and lower power consumption.

SUMMARY OF THE INVENTION

According to some embodiments of the present invention, a computer readable memory is provided that comprises at least one memory block. Each memory block has at least one programmable memory cell and is configured so that memory cells that are programmed are set to the same logic state.

Some embodiments of the present invention further provide a method of configuring computer readable memory. A signal for transmission to at least one memory block is received, each memory block comprising at least one programmable memory cell. Being responsive to the signal, each memory block being configured such that memory cells that are programmed are set to the same logic state.

The above and/or other aspects, features and/or advantages of various embodiments will be further appreciated in view of the following description in conjunction with the accompanying figures. Various embodiments can include and/or exclude different aspects, features and/or advantages where applicable. In addition, various embodiments can combine one or more aspect or feature of other embodiments where applicable. The descriptions of aspects, features and/or advantages of particular embodiments should not be construed as limiting other embodiments or the claims.

BRIEF DESCRIPTION OF THE DRAWINGS

The above and/or other exemplary features and advantages of the preferred embodiments of the present invention will become more apparent through the detailed description of exemplary embodiments thereof with reference to the accompanying drawings, in which:

FIGS. 3 and 4 illustrate a memory architecture with a memory cell and transmission gate(s);

FIGS. 5 and 6 illustrate a memory architecture with a memory cell and pass transistor(s);

Throughout the drawings, like reference numbers and labels should be understood to refer to like elements, features, and structures.

DETAILED DESCRIPTION

Exemplary embodiments of the present invention will now be described more fully with reference to the accompanying drawings. The matters exemplified in this description are provided to assist in a comprehensive understanding of various embodiments of the present invention disclosed with reference to the accompanying figures. Accordingly, those of ordinary skill in the art will recognize that various changes and modifications of the embodiments described herein can be made without departing from the scope and spirit of the claimed invention. Descriptions of well-known functions and constructions are omitted for clarity and conciseness.

Figure 1:
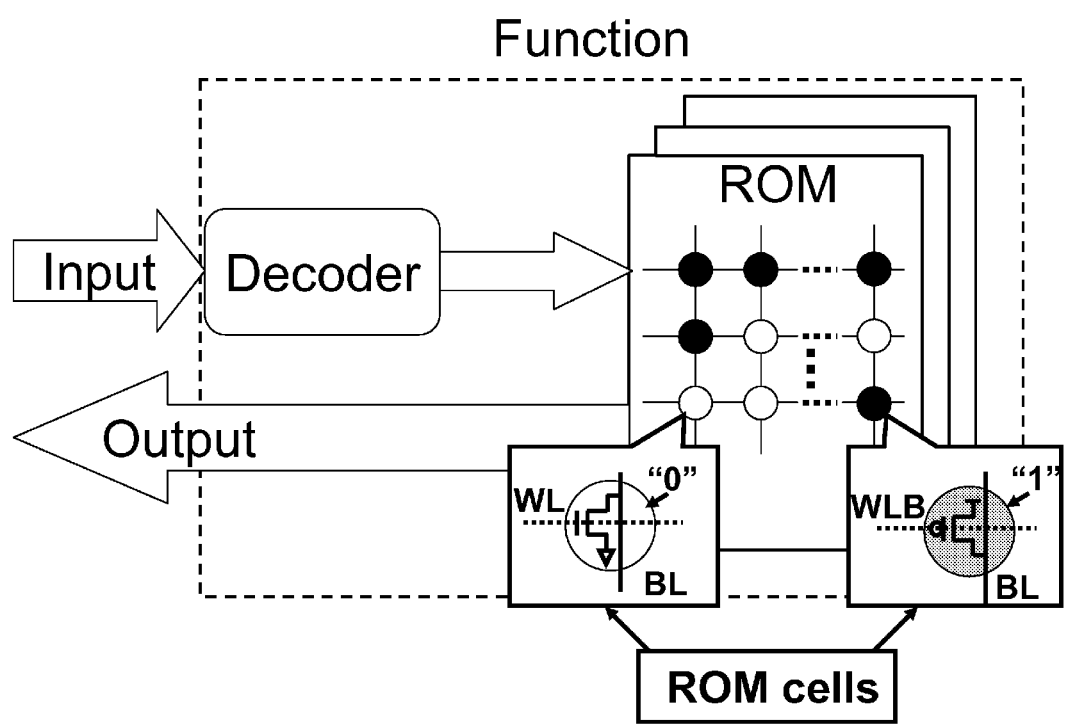
FIG. 1 illustrates a schematic featuring a single transistor memory cell in accordance with an embodiment of the present invention.

Embodiments of the present invention divide functions into an optimum number of smaller blocks that are optimised relative to data type. Such functions include digital logic functions. One exemplary embodiment implements the smaller blocks using a ROM-based design technique that supports improved operational performance and reduced power consumption. FIG. 1 illustrates a schematic featuring a single transistor memory cell in accordance with an embodiment of the present invention. In the embodiment illustrated by FIG. 1, a signal upon which a function is to operate enters a decoder, which then feeds the constituent memory blocks. The logic of each memory block is formed via individual transistor memory cells configured to operate as logic "0" or "1" depending upon how the cell is programmed. The memory block is organized via a matrix or array of word-lines (WLs) and bit-lines (BLs) that are actuated by one or more decoders, such as, for example, row and column decoders. In one embodiment the memory cell is accessible via a plurality of word-lines, such as, for example, "WL" to configure logic "0" and, alternatively, "WLB" to configure logic "1."

Memory blocks are optimized by configuring the block to a particular logic state; that is, restricting data storage in the block to either logic "0" or "1. " Thus, memory blocks comprise memory cells storing data of a same logic state; cells that do not have data are omitted from physical memory. The cells form a matrix of rows and columns, which can be asymmetrical. To account for the complement of the logic stored, a device external to the memory block is provided. This device is initialized to a logic state opposite of that stored in the memory block. Thus, during memory access, the opposite logic state of that stored in memory can be presumed since the memory architecture has been initialized to the opposite logic state. This initialized, presumed value is supplied to output when a memory location having no data is addressed. If during memory access, however, a cell containing data is addressed, the logic value stored in memory is then provided to the memory output, with the initialized device being isolated from output. Embodiments of the present invention provide for memory storing only logic "1" or, alternatively, storing only logic "0." The illustration in FIG. 1 shows the capability of programming logic "1" (WLB) and logic "0" (WL) but memory blocks configured in accordance with embodiments of the present invention will only store one logic state or the other at any one time; that is, memory cells are set to a same logic state. Memory size reduction can be realized by restricting physical memory to contain only cells that store data.

By reducing memory size, processing speed can be enhanced and power consumption reduced relative to conventional memory structures. This method of memory size reduction not only reduces total required circuit area, but also improves performance and power usage by reducing bit-line capacitances. Memory size can be further reduced by programming the memory such that identical, duplicate or redundant data rows and columns are eliminated from the memory block. In exemplary embodiments the memory block comprises a read only memory (ROM), thereby forming ROM-based logic (RBL) with single transistor ROM cell. Further exemplary embodiments provide memory blocks implementing one or more functions.

Figures 2, 2A, 2B:
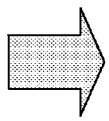
FIG. 2 shows an example of memory size reduction in accordance with an embodiment of the present invention.

FIG. 2 shows an example of memory size reduction in accordance with an embodiment of the present invention. In the example shown, a matrix of data is reduced by restricting storage to data of a similar type or logical state; that is, physical memory size can be reduced since it contains only cells that store data. Here, the stored data is restricted to a type that is logical "1"; data type of logical "0" is not stored. To provide a data type opposite to that stored, a device is provided that can be initialized to the opposite data type. Thus, when a memory address is sought for which there is no data, the initialized device provides the output. Accordingly, logical "0" data type can be presumed for this memory. Memory size can further be reduced by elimination of identical rows and columns. Note that while this example restricts storage to logical "1" data, memory can also be configured to restrict storage to logical "0" data, with logical "1" data being preassumed. The memory shown in FIG. 2 is an example of a memory required to generate the most significant bit (MSB) of a 4×4 multiplier in an RBL design after identical rows and columns have been eliminated. Note that a 4×4 multiplier requires eight memory blocks to generate the 8-bit output in RBL design. FIG. 2(a) shows a matrix that is 7×7, but when the memory is reduced in accordance with embodiments of the present invention, the 7×7 matrix of memory cells becomes the asymmetrical matrix of FIG. 2(b), representing a substantial reduction in memory size.

Figure 3:
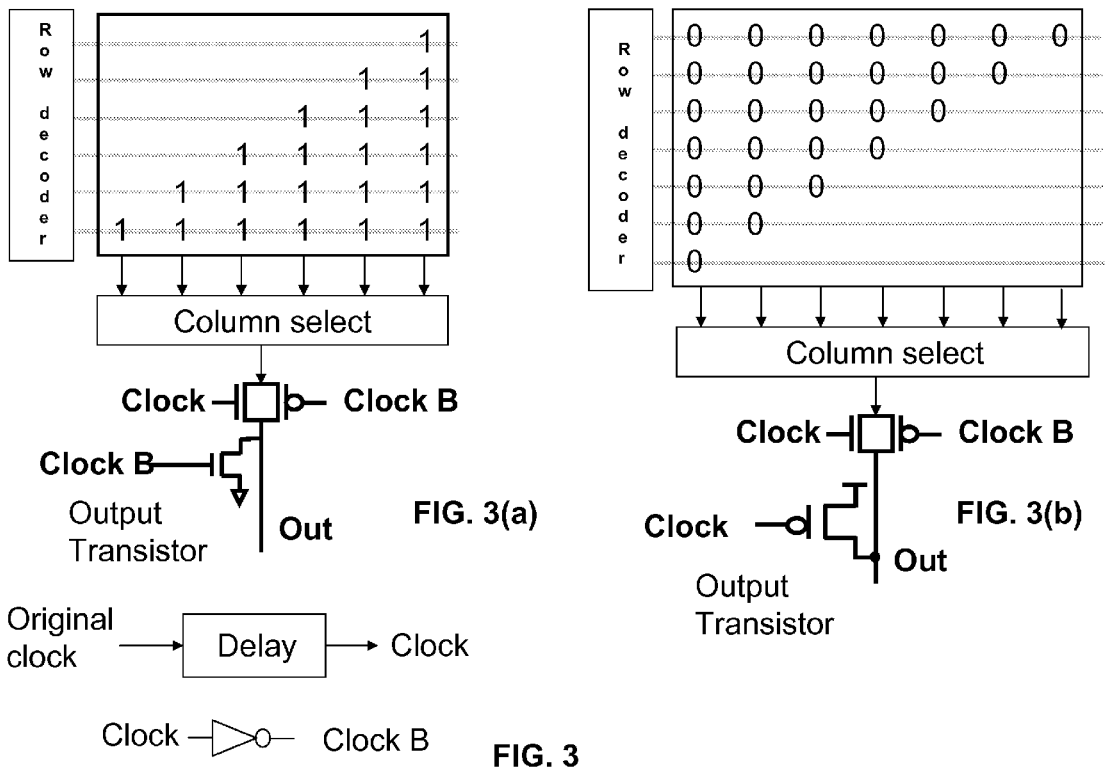

FIG. 3 shows a memory architecture in accordance with an embodiment of the present invention with only one type of cell ("1" or "0") stored in memory. In the example shown, FIG. 3(a) illustrates the condition where the memory output is initialized to "0" by a pull-down/output transistor, such as, for example, an NMOS transistor (shown). The transistor is driven by an inverted clock signal, shown as "Clock B." When the clock signal is "high," memory access is assumed. Note that in this embodiment the "clock" signal is delayed from the original clock signal, that is a first clock signal, in order to allow the row and column decoder operations to perform. A transmission gate is used on the output to prevent short circuit current when memory is not accessed; that is, when the clock signal is "low."

FIG. 3(b) illustrates a similar memory architecture but storing only data of type logical "0." The same structure as shown in FIG. 3(a) is employed, except a p-type pull-up/output transistor, such as, for example, a PMOS transistor, is used to initialize the bit-line output to "high." A transmission gate is also used on the output to prevent short circuit current when memory is not accessed. Transmission gates provide two parallel transistors, a p-type and an n-type, operable simultaneously. P-type transistors, such as PMOS, are effective for passing "1s," whereas n-type transistors, such as NMOS, are effective for passing "0s." Thus, transmission gates are useful when the type of signal to the gate is unknown ("1" or "0"). Pass transistors, which are singular (shown in FIGS. 5 & 6), are useful when the type of signal is known.

FIG. 4 shows another embodiment of a memory structure configured in accordance with the present invention. In the embodiment shown in FIG. 4, the transmission gates are placed on word-lines instead of the output. Though this increases the number of transmission gates required for the memory design, it does, however, permit full discharge of the memory before read access. Memory is discharged in the example storing logical "1," and charged in the example storing logical "0," since after each read access the respective bit-line is discharged or charged through the initialization transistor. As with FIG. 3, FIG. 4(a) illustrates a memory architecture storing logical "1," and FIG. 4(b) a memory architecture storing logical "0." Also, as with the embodiment of FIG. 3, the "clock" signal is delayed from the original clock signal, that is a first clock signal, in order to allow the row and column decoder operations to perform.

FIGS. 5 and 6 show additional embodiments of a memory structure configured in accordance with the present invention. In the embodiments shown in FIGS. 5 and 6, the transmission gates are replaced with pass transistors. Because signals in the memory structure are unidirectional and predictive, pass transistors can be used to further reduce the circuit size.

As with FIGS. 3 and 4, FIGS. 5(a) and 6(a) illustrate a memory architecture storing logical "1," and FIGS. 5(b) and 6(b) a memory architecture storing logical "0." Clock signals are delayed from the original clock signal, that is, a first clock signal, in order to allow the row and column decoder operations to perform.

Figure 7:
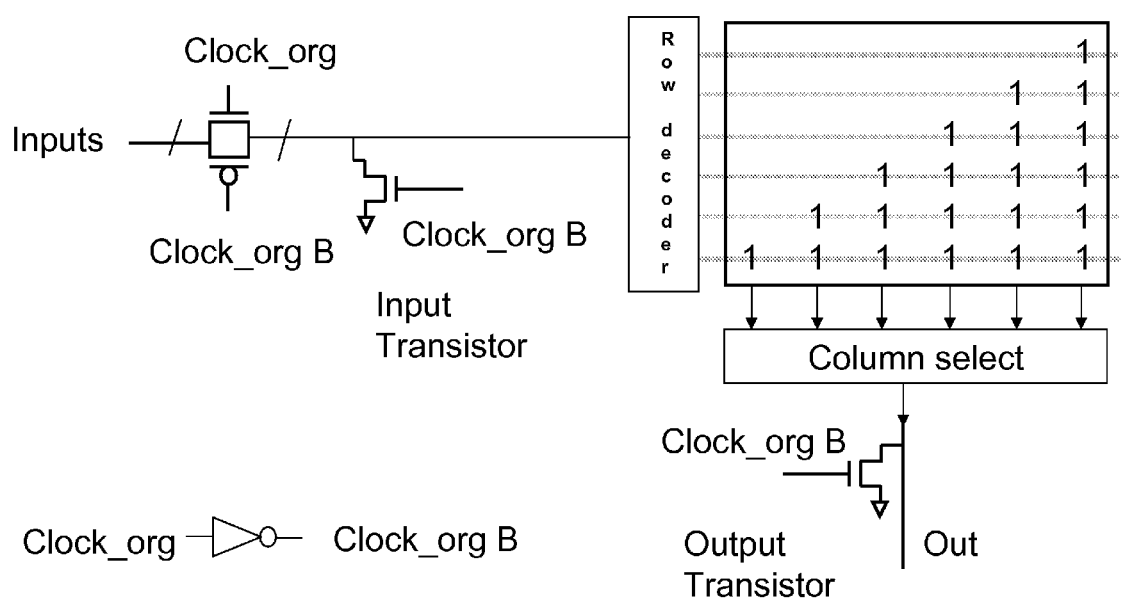
FIG. 7 illustrates a memory architecture with one type of cell with no clock delay element.

FIG. 7 shows a memory architecture with only one data type stored in the cell ("1") in accordance with another embodiment of the present invention. In the example shown, FIG. 7 illustrates the condition where the output is initialized to "0" by a pull-down transistor on the output, such as, for example, an NMOS transistor (shown). In this embodiment, however, no clock delay element is required so the original clock signal can be used to trigger both input and output transistors.

Referencing FIG. 2, if all inputs to the memory architecture are zero, then the first row of memory will be selected by the row decoder. FIG. 2(a) shows the top row of the memory matrix as containing only zeros. In the modified memory of FIG. 2(b), however, this row doesn't physically exist. Thus, when memory is not being accessed, it is safe to point the row detector to an inactive row, such as, in this example, the zero$^{th}$ row, since this effectively prevents short circuit currents.

Referring back to FIG. 7, when the clock signal is low memory is not being accessed. Accordingly, when the clock signal is low each input transistor is configured to pull inputs to the row decoder low so that row zero is selected. Thus, the input transistor serves to pull all inputs to "0" when memory is not being accessed. Meanwhile, the transmission gates on the input lines block external data signals from entering the memory in order to isolate the input transistors from the actual data input. If this were not the case, the appearance of a data signal on the input while the input transistor is driven low by the clock could cause a short circuit to occur.

On the other hand, when the clock is high, the input transistor is disabled and the transmission gate forwards input data to the row decoder so that memory can be accessed. If the input data is combined such that a row which exists is addressed, then the column select identifies a specific cell in the row. Both row and column decoder inputs are obtained from the input data signal. The rows (WLs) and columns (BLs) are essentially just metal lines; they are not directly connected. The row decoder provides a particular signal for a particular row. The signal propagates on the metal line of the row, selecting all cells in that particular row. A connection occurs if a memory cell is present, which in exemplary embodiments comprises a transistor. If there is no memory cell, then there is no connection. Thus, even if the input data signal instructs the row (and column) detector to address a specific cell, if there is no data in that cell, then there is no connection; it is an open circuit. And when physical memory does not exist because there is no stored data, memory output will return the initialized value, that is, it will remain unchanged, which in this example is "0." If the column select identifies a position in memory where there is data, however, then memory output will change from the initialized value to the value stored in memory.

After a high clock signal, the output transistor is re-initialized to pull the memory output low. That is, when the clock is low, Clock_org B is high and the output transistor is ON, pulling memory output to "0" and discharging the column. Because the column is discharged prior to memory access, memory output is deterministic in that a "0" is returned unless a cell having data is addressed. In exemplary embodiments column select comprises a pass transistor, transmission gate or other complex structure. Embodiments also provide the memory block as comprising non-volatile memory, such as, for example, read only memory (ROM).

In the example illustrated by FIG. 7, the memory is configured to store logical "1" type data. Alternatively, the same memory structure can be employed to store data of type logical "0." When this occurs, p-type input and output transistors, such as, for example, PMOS transistors, may then be used, and the clock signal "Clock_org" would be used to trigger the transistors.

Figure 8:
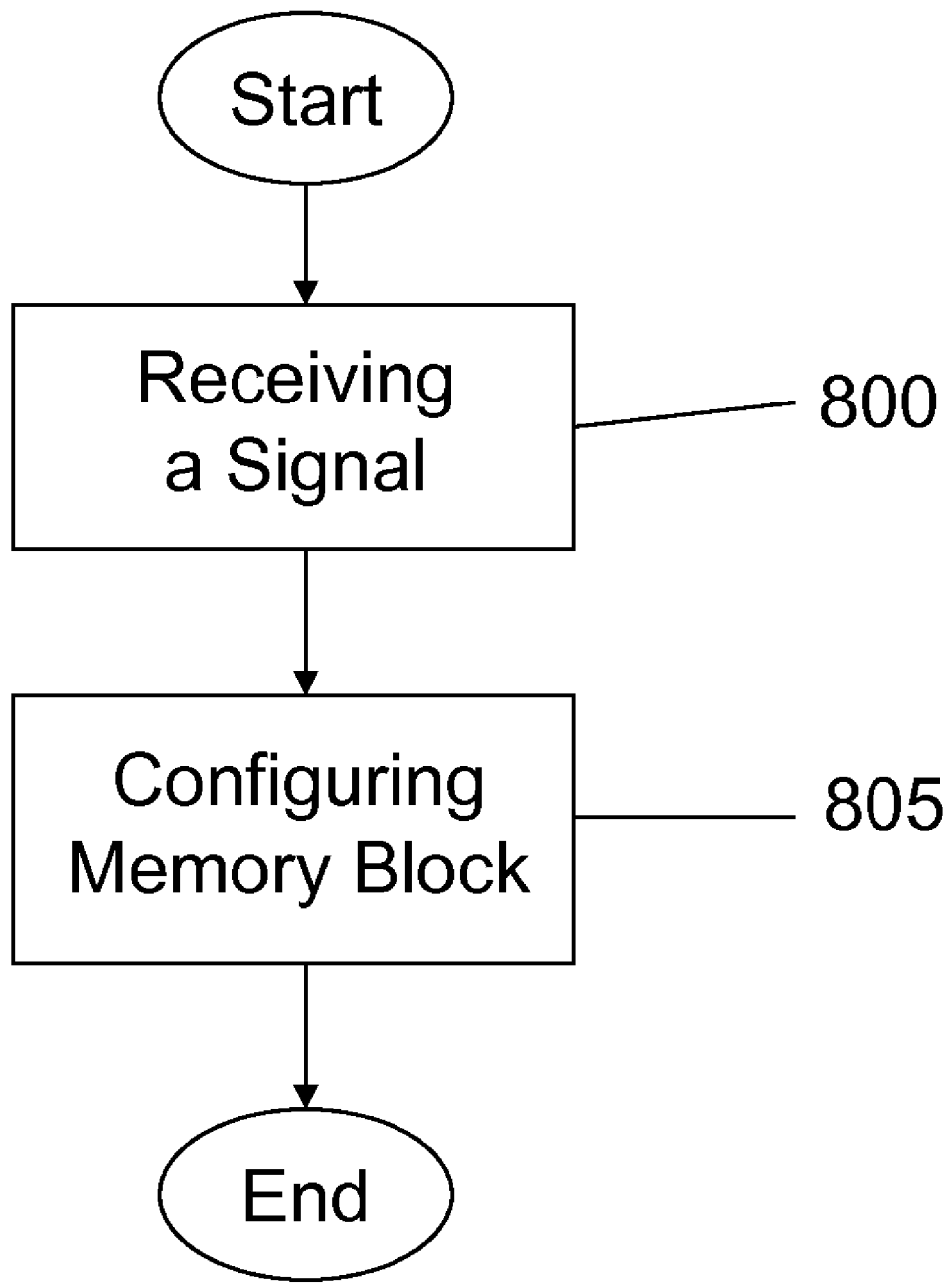
FIG. 8 is a flow diagram depicting certain steps of a method of configuring computer readable memory in accordance with an embodiment of the present invention.

FIG. 8 is a flow diagram depicting steps of a method of configuring computer readable memory in accordance with an embodiment of the present invention. In step 800, a signal is received for transmission to at least one memory block. Each memory block receiving a signal comprises at least one programmable memory cell. In step 805, each memory block receiving a signal is configured such that memory cells that are programmed are set to the same logic state. In embodiments of the present invention the at least one programmable memory cell comprises a transistor such that when the at least one memory block comprises a plurality of programmable memory cells, the memory cells form a matrix of rows and columns. In exemplary embodiments the matrix consists of programmed cells arranged asymmetrically such that the memory block consists entirely of programmed cells; that is, the memory block consists only of cells that store data. Duplicate rows and columns can be eliminated to further reduce memory size. Embodiments of the present invention further provide that each memory block comprises a read only memory (ROM).

Figure 9:
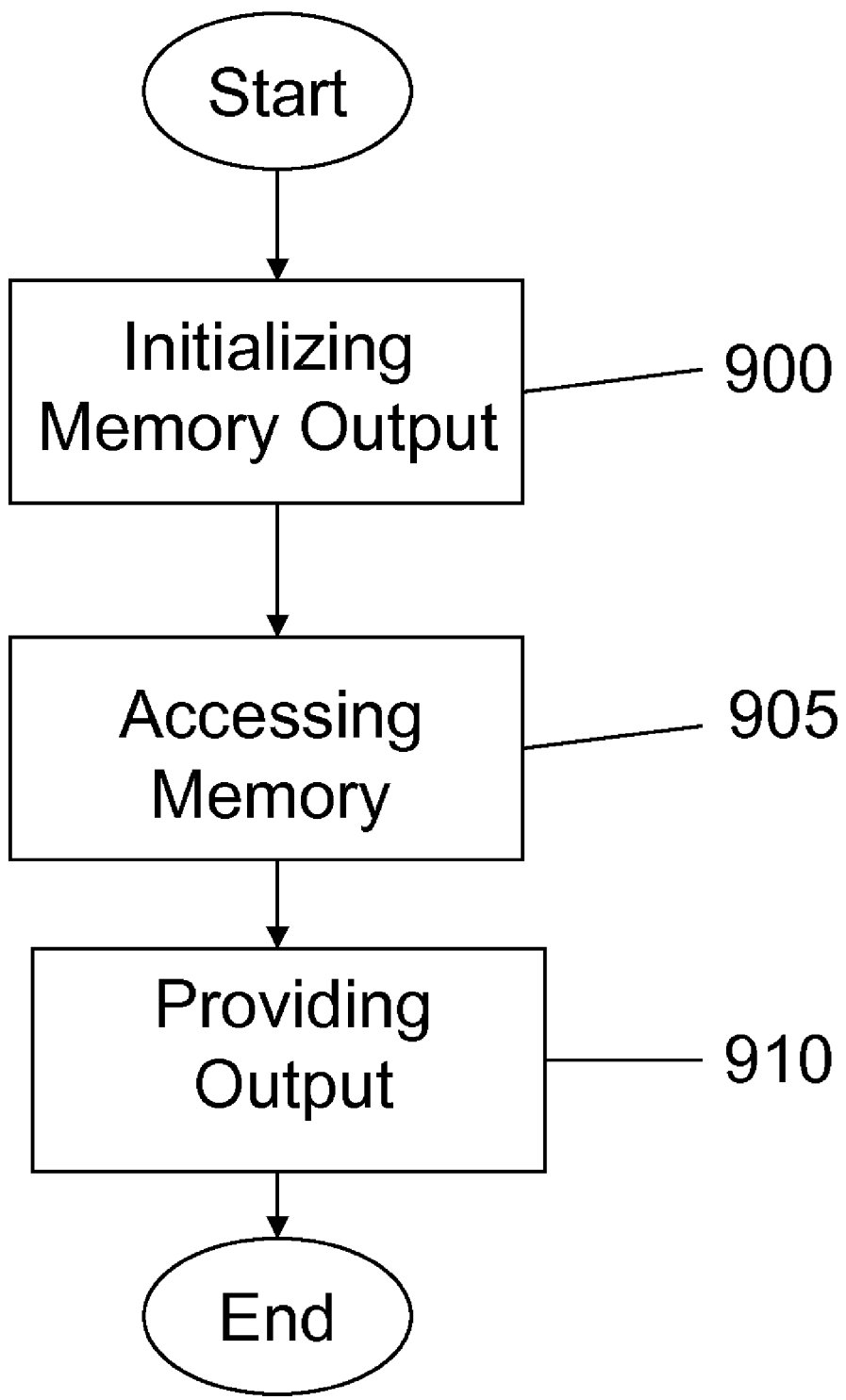
FIG. 9 is a flow diagram depicting certain steps of a method of accessing a computer readable memory architecture in accordance with an embodiment of the present invention.

FIG. 9 is a flow diagram depicting steps of a method of accessing a computer readable memory architecture in accordance with an embodiment of the present invention. In step 900, memory output is initialized to a data type ("0" or "1") that is opposite to the data type stored in memory ("1" or "0"). In step 905, memory is accessed via the architecture's wordlines (WLs) and bit-lines (BLs), selectable by row and column decoders. Each memory block comprises a plurality of programmed memory cells set to a same logic state with the memory cells forming a matrix of rows and columns. Embodiments provide reduction of memory size restricting physical memory to contain only cells that store data. Memory size can further be reduced by configuring memory such that duplicate rows and columns are eliminated. Embodiments of the present invention provide pass transistors or transmission gates, responsive to clock signals, coupled to memory output and input. For example, certain embodiments provide for activating a transmission gate via a row decoder, wherein a transmission gate is electrically coupled to each word-line. In an alternate embodiment, a pass transistor is activated via a row decoder, a pass transistor being electrically coupled to each word-line. Additional embodiments provide for activating input transistors, responsive to a clock signal, wherein the input transistors are electrically coupled to the row decoder and configured to drive input to the row decoder low in response to a low clock signal. Other embodiments, storing an opposite data type, provide for the input transistor driving input to the row decoder high in response to a high clock signal. The clock signal may or may not be delayed relative to a first clock signal, depending on the configuration of the memory architecture. Embodiments provide the memory block as comprising non-volatile memory, such as, for example, read only memory (ROM). Optional step 910 provides a memory output in response to accessing memory at a location where a cell stores data.

While the present invention has been particularly shown and described with reference to certain exemplary embodiments thereof, it will be understood by those of ordinary skill in the art that various changes in form and detail may be made therein without departing from the spirit and scope of the present invention as defined by the appended claims. For example, the various memory architectures presented above are but a few examples implementing a memory storing only logical "1s" or "0s" in accordance with the present invention; many other architectures can also be employed to efficiently access memory so configured.

The present invention will also facilitate use of emerging devices as memory cells. For example, in many emerging technologies, such as carbon nanotube FETs and nanowire FETs, obtaining both efficient p-type (for example, PFET) and n-type (for example, NFET) transistors can be extremely difficult. This invention will greatly help adoption and use of such emerging devices for improved performance and low power consumption. Hence, a benefit of the present invention is that it can facilitate hybridization of existing and emerging technologies to obtain maximum benefit. Finally, the present invention is not limited only to ROM-based designs; it can be used with any memory architecture where reduction in memory size is desired.

What is claimed is:

1. A computer readable memory, comprising:
    at least one memory block, each memory block comprising at least one programmable memory cell,
    wherein each block is configured such that memory cells which are programmed are set to a same logic state,
    wherein the at least one programmable memory cell comprises a transistor such that when the at least one memory block comprises a plurality of programmable memory cells, the memory cells form a matrix of rows and columns, wherein the matrix consists entirely of programmed memory cells, and wherein the matrix is asymmetrical.

2. The computer readable memory of claim 1, wherein the memory cells are programmed such that duplicate rows and columns are eliminated.

3. The computer readable memory of claim 2, wherein each memory block comprises a read only memory (ROM).

4. A computer readable memory, comprising:

at least one memory block, each memory block comprising at least one programmable memory cell, wherein each block is configured such that memory cells which are programmed are set to a same logic state, and wherein the at least one memory block consists entirely of programmed memory cells, the memory cells being programmed such that duplicate rows and columns are eliminated.

5. The computer readable memory of claim 4, wherein the at least one programmable memory cell is accessible via at least one word-line (WL) and at least one bit-line (BL), the at least one WL being selectable by a row decoder and the at least one BL being selectable by a column decoder.

6. The computer readable memory of claim 5, wherein a pass transistor, responsive to a clock signal, is electrically coupled to the memory output and operable to prevent short circuit current.

7. The computer readable memory of claim 5, wherein a transmission gate, responsive to a clock signal, is electrically coupled to memory output and operable to prevent short circuit current.

8. The computer readable memory of claim 7, wherein the clock signal is delayed relative to a first clock signal.

9. The computer readable memory of claim 5, wherein a transmission gate is electrically coupled to each WL, each transmission gate being selectable by the row decoder.

10. The computer readable memory of claim 5, wherein a pass transistor is electrically coupled to each WL, each pass transistor being selectable by the row decoder.

11. The computer readable memory of claim 5, further comprising:

a plurality of input transistors, responsive to a clock signal, electrically coupled to the row decoder and operable to provide signals to the row decoder;

a plurality of transmission gates, responsive to the clock signal and its complement, electrically coupled to the row decoder and the input transistors, wherein each transmission gate is configured to isolate its electrically coupled input transistor from input data signals; and an output transistor, responsive to the clock signal, electrically coupled to a memory output and configured to provide an initialized output.

12. The computer readable memory of claim 11, wherein the input transistors are configured to drive all inputs to the row decoder low in response to a low clock signal.

13. The computer readable memory of claim 11, wherein the clock signal is not delayed relative to a first clock signal.

14. The computer readable memory of claim 13, wherein each memory block comprises a read only memory (ROM).

15. A method of configuring the computer readable memory of claim 1 the method comprising:

receiving a signal for transmission to at least one memory block, each memory block comprising at least one programmable memory cell; and responsive to the signal, configuring each memory block such that memory cells which are programmed are set to a same logic state.

16. The method of claim 15, wherein the at least one programmable memory cell comprises a transistor such that when the at least one memory block comprises a plurality of programmable memory cells, the memory cells form a matrix of rows and columns.

17. The method of claim 16, wherein the matrix consists entirely of programmed memory cells arranged asymmetrically.

18. The method of claim 15, further comprising:

programming the memory cells such that the at least one memory block consists entirely of programmed memory cells and duplicate rows and columns are eliminated.

19. The method of claim 18, wherein each memory block comprises a read only memory (ROM).

20. A method of accessing the computer readable memory of claim 1 the method comprising:

initializing a memory output; and accessing at least one memory block via a word-line (WL) and a bit-line (BL), the WL being selectable by a row decoder and the BL being selectable by a column decoder, wherein each memory block comprises a plurality of programmed memory cells set to a same logic state.

21. The method of claim 20, wherein the memory cells form a matrix of rows and columns such that the memory blocks consists entirely of programmed cells.

22. The method of claim 21, further comprising:

activating a pass transistor, responsive to a clock signal, wherein the pass transistor is electrically coupled to the memory output.

23. The method of claim 21, further comprising:

activating a transmission gate, responsive to a clock signal, wherein the transmission gate is electrically coupled to the memory output.

24. The method of claim 22, wherein the clock signal is delayed relative to a first clock signal.

25. The method of claim 23, wherein the clock signal is delayed relative to a first clock signal.

26. The method of claim 21, further comprising:

activating a transmission gate, responsive to a clock signal, the transmission gate being electrically coupled to an input transistor and the row decoder.

27. The method of claim 21, further comprising:

activating an input transistor, responsive to a clock signal, the input transistor being electrically coupled to the row decoder and configured to drive input to the row decoder low.

28. The method of claim 26, wherein each memory block comprises a read only memory (ROM).

29. The method of claim 28, wherein the clock signal is not delayed relative to a first clock signal.

30. The method of claim 27, wherein the clock signal is not delayed relative to a first clock signal.

31. A computer readable memory architecture, comprising:

a memory block comprising a plurality of programmable memory cells forming a matrix, wherein the cells are programmed to a same logic state, a plurality of input transistors, responsive to a clock signal, electrically coupled to a row decoder and operable to provide signals to the row decoder;

a plurality of transmission gates, responsive to the clock signal, electrically coupled to the row decoder and the input transistors, wherein each transmission gate is configured to isolate its electrically coupled input transistor from input data signals; and an output transistor, responsive to the clock signal, electrically coupled to a memory output and configured to provide an initialized output.

32. The computer readable memory architecture of claim 31, wherein the memory block comprises a read only memory (ROM).

33. The computer readable memory architecture of claim 31, wherein the matrix is asymmetrical, formed entirely of programmed cells.

34. The computer readable memory architecture of claim 33, wherein the memory block comprises a read only memory (ROM).

35. The computer readable memory architecture of claim 34, wherein the programmed memory cells implement a function.

36. The computer readable memory architecture of claim 33, wherein duplicate rows and columns are eliminated.

* * * * *